(12) United States Patent
Jiang et al.

(10) Patent No.: US 8,053,757 B2
(45) Date of Patent: Nov. 8, 2011

(54) GALLIUM NITRIDE LIGHT-EMITTING DEVICE WITH ULTRA-HIGH REVERSE BREAKDOWN VOLTAGE

(75) Inventors: Fengyi Jiang, Nanchang (CN); Li Wang, Jiang Xi (CN); Wenqing Fang, Jiang Xi (CN); Chunlan Mo, Jiang Xi (CN); Yong Pu, Jiang Xi (CN); Chuanbing Xiong, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 0 days.

(21) Appl. No.: 12/159,850

(22) PCT Filed: Aug. 31, 2007

(86) PCT No.: PCT/CN2007/002616
§ 371 (c)(1),
(2), (4) Date: Jul. 1, 2008

(87) PCT Pub. No.: WO2009/026748
PCT Pub. Date: Mar. 5, 2009

(65) Prior Publication Data
US 2011/0006319 A1 Jan. 13, 2011

(51) Int. Cl.
*H01L 29/06* (2006.01)

(52) U.S. Cl. ............ 257/14; 257/E33.008; 438/22
(58) Field of Classification Search .......... 257/13, 257/14, 79, 94, 96, 97, E33.008, E21.085, 257/E33.033, E33.034, E33.031, E33.028; 438/22, 29, 41
See application file for complete search history.

(56) References Cited

U.S. PATENT DOCUMENTS

| 6,017,774 | A  | * | 1/2000  | Yuasa et al. ............... 438/46 |
| 6,091,085 | A  | * | 7/2000  | Lester ...................... 257/103 |
| 6,881,983 | B2 | * | 4/2005  | Narayan et al. ............ 257/94 |
| 7,436,045 | B2 | * | 10/2008 | Kobayakawa et al. ...... 257/615 |

* cited by examiner

*Primary Examiner* — David Vu
(74) *Attorney, Agent, or Firm* — Shun Yao; Park, Vaughan, Fleming & Dowler LLP

(57) ABSTRACT

One embodiment of the present invention provides a gallium nitride (GaN)-based semiconductor light-emitting device (LED) which includes an n-type GaN-based semiconductor layer (n-type layer); an active layer; and a p-type GaN-based semiconductor layer (p-type layer). The n-type layer is epitaxially grown by using ammonia gas ($NH_3$) as the nitrogen source prior to growing the active layer and the p-type layer. The flow rate ratio between group V and group III elements is gradually reduced from an initial value to a final value. The GaN-based LED exhibits a reverse breakdown voltage equal to or greater than 60 volts.

27 Claims, 2 Drawing Sheets

GALLIUM NITRIDE LIGHT-EMITTING DEVICE WITH ULTRA-HIGH REVERSE BREAKDOWN VOLTAGE

RELATED APPLICATION

This application is a national-stage application of and hereby claims priority under 35 U.S.C. §120, §365(c), and §371 to PCT Application No PCT/CN2007/002616, filed 31 Aug. 2007.

BACKGROUND

1. Field of the Invention

The present invention relates to the design and fabrication of gallium nitride (GaN) semiconductor light-emitting devices. More specifically, the present invention relates to methods for fabricating GaN-based semiconductor light-emitting devices with ultra-high reverse breakdown voltages.

2. Related Art

Recent success in the development of gallium nitride-based light emitting devices (LEDs) and lasers not only extends the light-emission spectrum to the green, blue, and ultraviolet region, but also can achieve high light emission efficiency. This is because GaN materials have a large direct-band-gap to allow photonic emission in these spectra. Because of their high energy-efficiency, high brightness, and long lifetime, GaN-based semiconductor LEDs have been widely used in applications including full-color large-screen displays, traffic lights, backlight sources, and solid-state lighting.

A GaN-based LED typically includes a p-n junction structure. A GaN-LED can also include a GaN-based n-type semiconductor layer, a multiple-quantum-well (MQW) active region, and a GaN-based p-type semiconductor layer. During light emission, the p-n junction or MQW region is forward-biased at a voltage which causes a current to flow from the p-type layer to the n-type layer through the active layer. However, the LED can sometimes become reversely biased due to a number of reasons, for example, being subject to electrostatic discharge (ESD) or being accidentally connected to a reverse voltage source. Furthermore, an LED becomes reversely biased when an alternating voltage is used to drive the LED.

When the LED is reversely biased, little current (referred to as a "reverse current") flows through the p-n junction until the reverse voltage reaches the level of the reverse breakdown voltage of the GaN-based LED. When the bias voltage exceeds the breakdown voltage, even momentarily, the reverse current increases significantly which could lead to permanent damage to the LED. Note that a reverse bias due to ESD can be particularly harmful because the ESD voltage can be much higher than the typical reverse breakdown voltage of an LED, and the occurrence of an ESD event is often unpredictable. Conventional GaN-based LEDs typically exhibit low reverse breakdown voltages, and hence are vulnerable to these reverse breakdown risks.

It is generally desirable to fabricate GaN-based LEDs with high reverse breakdown voltage to increase the reliability of the LED. However, it has been difficult to achieve high reverse breakdown voltages in practice.

SUMMARY

One embodiment of the present invention provides a gallium nitride (GaN)-based semiconductor light-emitting device (LED) which includes an n-type GaN-based semiconductor layer (n-type layer); an active layer; and a p-type GaN-based semiconductor layer (p-type layer). The n-type layer is epitaxially grown by using ammonia gas ($NH_3$) as the nitrogen source prior to growing the active layer and the p-type layer. The flow rate ratio between group V and group III elements, or V/III ratio, during the epitaxial growth of the n-type layer is gradually reduced from an initial value to a final value.

In a variation on this embodiment, the GaN-based LED exhibits a reverse breakdown voltage equal to or greater than 60 volts.

In a variation on this embodiment, the initial V/III ratio is approximately between 1000 and 10000, and the final V/III ratio is approximately between 150 and 500.

In a further variation, the initial V/III ratio is approximately between 2000 and 5000.

In a further variation, the final V/III ratio is approximately between 200 and 300.

In a variation on this embodiment, the active layer is sufficiently close to the location in the n-type layer where the final V/III ratio is reached.

In a further variation on this embodiment, the active layer is within 1000 angstroms to the location in the n-type layer where the final V/III ratio is reached.

In a variation on this embodiment, the V/III ratio reduction process starts shortly after the n-type layer epitaxial growth begins.

In a variation on this embodiment, the V/III ratio reduction process is substantially linear with a substantially constant reduction rate.

In a variation on this embodiment, the duration of the reduction of the V/III ratio from the initial V/III ratio to the final V/III ratio is sufficiently long.

In a variation on this embodiment, the reverse breakdown voltage of the GaN-based LED is equal to or greater than 110 volts.

In a variation on this embodiment, the turn-on voltage of the GaN-based LED is equal to or less than 3 volts.

In a variation on this embodiment, the active layer is an InGaN/GaN multiple-quantum-well (MQW) layer.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Overview

Embodiments of the present invention facilitate fabricating GaN-based LEDs with ultra-high reverse breakdown voltages. Specifically, structures of such GaN-based LEDs are fabricated by growing an n-type layer, which is followed by epitaxially growing an active layer and a p-type layer. While depositing the n-type layer, ammonia gas ($NH_3$) is used as the nitrogen source. Instead of using a constant $NH_3$ flow rate, the $NH_3$ flow rate is regulated such that the flow rate ratio between group V elements and group III elements, which is referred to as the V/III ratio, is gradually reduced from an initial value to a final value that is significantly lower than the initial value. The process of V/III ratio reduction is controlled so that the rate of change is decremental and the duration of the reduction process is sufficiently long. In the final structure of the GaN-based LED, the active layer is sufficiently close to the location in the n-type layer where the final V/III ratio is reached.

A GaN-Based LED Structure

Figure 1:
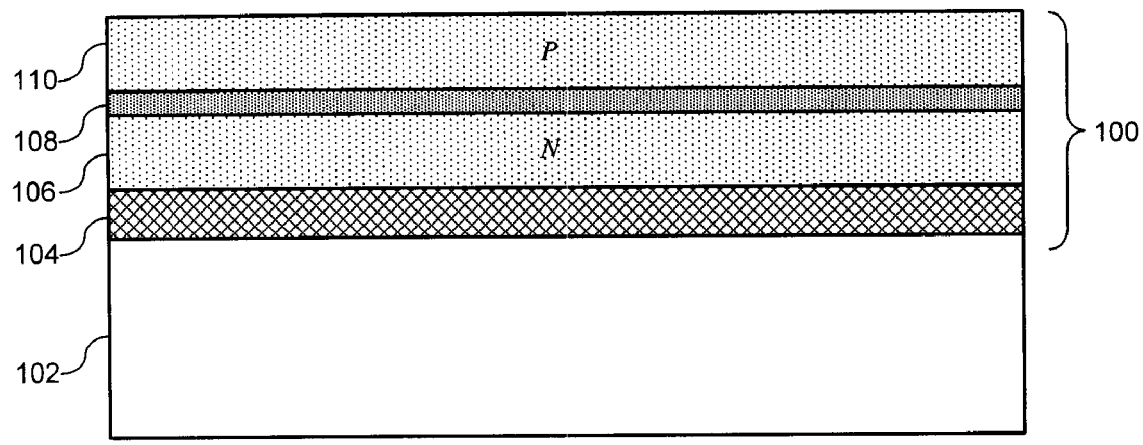
FIG. 1 illustrates a cross-sectional view of a GaN-based LED structure.

FIG. 1 illustrates a cross-sectional view of a GaN-based LED structure 100 in accordance with one embodiment of the present invention. As shown in FIG. 1, GaN-based LED structure 100 is fabricated on a substrate 102. Substrate 102 can include, but is not limited to, a sapphire ($Al_2O_3$) substrate, a silicon carbide (SiC) substrate, a gallium arsenide (GaAs) substrate, and/or a silicon (Si) substrate.

Note that GaN-based LED structure 100 comprises an n-type layer 106, an active layer 108, and a p-type layer 110. These three layers form the basic structure of the LED device. More specifically, in one embodiment, n-type layer 106 is first epitaxially grown on substrate 102, which is followed by growth of active layer 108 and p-type layer 110. In one embodiment of the present invention, active layer 108 comprises an InGaN/GaN MQW structure. A MQW structure facilitates a higher carrier density and hence an increased recombination rate of the carriers, which can improve light-emitting efficiency.

Optionally, a buffer layer 104 can be formed on substrate 102 prior to growing n-type layer 102. This is beneficial for lattice-constant and/or thermal-expansion coefficient matching purposes. Although not shown in FIG. 1, GaN-based LED structure 100 can also include an n-type electrode and a p-type electrode which are electrically coupled to n-type layer 106 and p-type layer 110, respectively. Note that these electrodes can be fabricated with any configurations by using any electrode-fabrication techniques. Such techniques include physical vapor deposition and/or chemical vapor deposition.

Techniques for epitaxially growing GaN-based LED structure 100 can include, but are not limited to, metalorganic chemical vapor deposition (MOCVD), molecular beam epitaxial (MBE), Hydride Vapor Phase Epitaxy (HYPE), and/or metalorganic Vapor Phase Epitaxy (MOVPE).

Note that epitaxial growth of n-type GaN layer 106 on substrate 102 requires both a Ga source and a N source. In particular, Trimethylgallium (TMGa) and ammonia ($NH_3$) can be used as the Ga (group III) and N (group V) sources, respectively. During n-type layer fabrication, both TMGa and $NH_3$ are in gas phase and these gases are introduced into the deposition chamber at a predetermined flow rate.

Typically, a certain V/III ratio is maintained during the fabrication process for the n-type layer. In a typically n-type layer fabrication process, the V/III ratio is kept approximately between 1000 and 10000, preferably between 2000 and 5000.

Achieving Ultra-High Reverse Break-Down Voltage by Varying $NH_3$ Flow Rate

Figure 2:
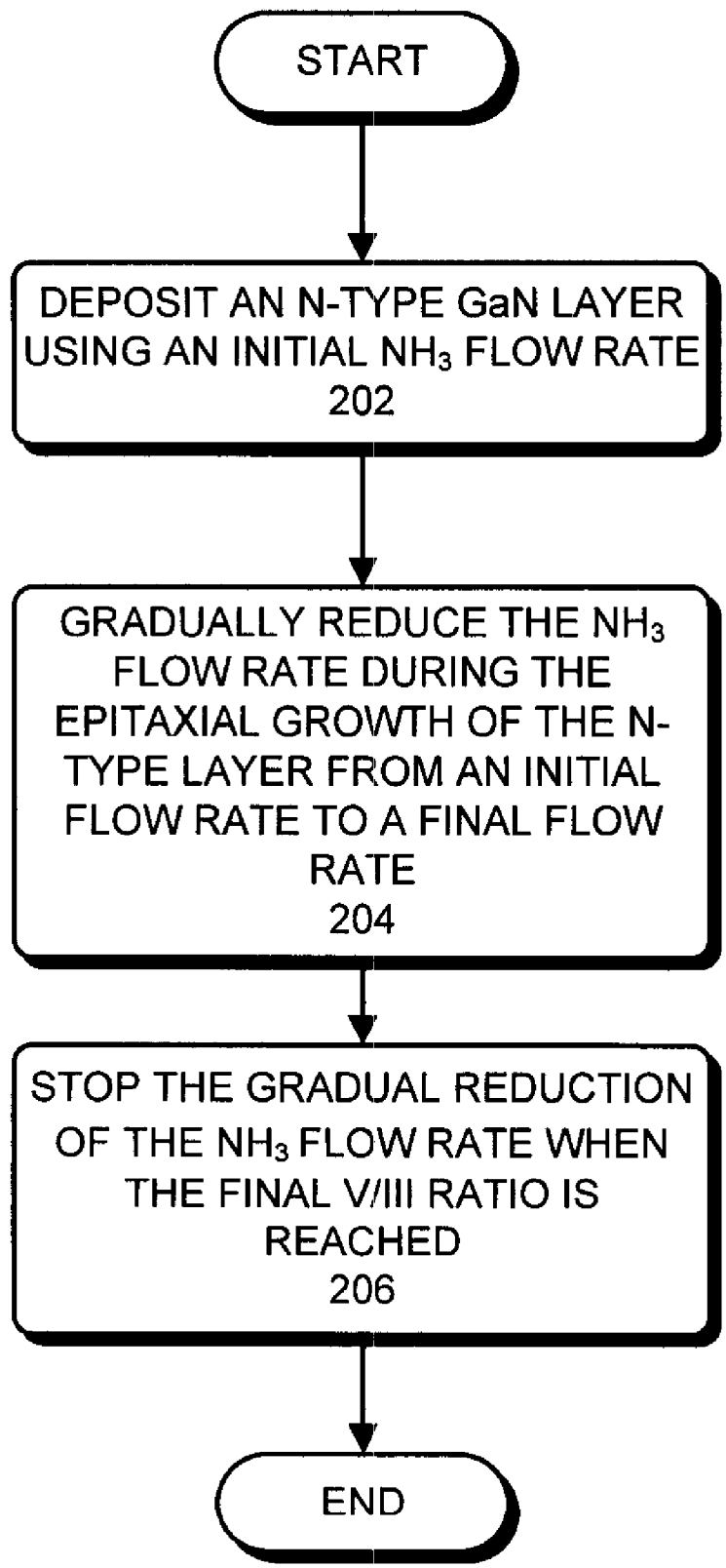
FIG. 2 presents a flowchart illustrating the process of growing an n-type GaN layer while varying the $NH_3$ flow rate in accordance with one embodiment of the present invention.

Embodiments of the present invention provide a method for achieving ultra-high reverse breakdown voltages of a GaN LED by varying the $NH_3$ flow rate during the n-type layer deposition, so that the V/III ratio is reduced from a conventional value to a final value less than the conventional value. FIG. 2 presents a flowchart illustrating the process of growing an n-type layer while varying the $NH_3$ flow rate in accordance with one embodiment of the present invention.

The process starts with deposition of an n-type layer using an initial $NH_3$ flow rate that corresponds to an initial V/III ratio (operation 202). In one embodiment of the present invention, the initial flow rate can be a regular flow rate typically used for epitaxial growth of an n-type layer, and the initial V/III ratio can be between 1000 and 10000. Note that the flow rate of TMGa is also set to a normal value, which is typically expressed as μmol/min. In practice, the ratio of $NH_3$ flow rate to TMGa flow rate can be approximately 2000-5000.

After the n-type GaN deposition has started, the process then gradually reduces the $NH_3$ flow rate from the initial flow rate to a final flow rate which results in a final V/III ratio (operation 204). In one embodiment, the reduction of $NH_3$ flow rate can begin shortly after the epitaxial growth has started. In a further embodiment, the $NH_3$ flow rate can start to decrease after the epitaxial growth at the initial flow rate has proceeded for a predetermined period of time. Note that the final flow rate is significantly smaller than the initial flow rate. In one embodiment of the present invention, the final V/III ratio is between approximately 10% and 30% of the initial V/III ratio. For example, if the initial V/III ratio is 2200, the final V/III ratio can be approximately 250. Since the actual flow of source gases depends on various conditions of the deposition, such as the deposition-chamber size and growth efficiency, the actual flow rates may vary.

Note that the reduction of the V/III ratio from the initial value to the final value, which in one embodiment is achieved by reducing the $NH_3$ flow rate, can follow different forms, which can be approximated by different functions. These functions can include, but are not limited to: a linear reduction with a constant reduction rate, or a non-linear reduction based on curve with a varying reduction rate. Furthermore, the flow-rate-reduction process can be based on a series of discrete small steps, instead of smooth, continuous changes. In a further embodiment, operation 204 can include a combination of the above reduction techniques. For example, the flow-rate-reduction process can start with a linear reduction until an intermediate flow rate is reached, and then continue to follow a non-linear reduction toward the final flow rate.

Because the $NH_3$ flow rate change is gradual and the overall flow rate change is significant, the duration of the flow rate reduction from the initial flow rate to the final flow rate is ideally sufficiently long. In one embodiment of the present invention, the duration of this process is equal to or greater than 50% of the total epitaxial growth time of the n-type layer.

Next, the process discontinues the gradual reduction of the $NH_3$ flow rate when the final flow V/III ratio has been reached (operation 206). Note that the location in the n-type layer where the final flow rate is reached is ideally sufficiently close the interface between the n-type layer and the active layer. In one embodiment of the present invention, the active layer is approximately within 1000 angstroms from the location in the n-type layer where the final flow rate is reached. In a further embodiment, the interface between the active layer and n-type layer is where the final flow rate is reached. Note that the final flow rate may be reached before the completion of the n-type layer epitaxial growth. In this case, the system can continue to provide $NH_3$ at the final flow rate until the end of the n-type layer deposition process.

In one embodiment of the present invention, the TMGa flow rate can be kept as a constant throughout the process of the n-type layer deposition process. In further embodiments, the TMGa flow can be varied to assist the reduction of V/III ratio. For example, the TMGa flow can be increased while the $NH_3$ flow is reduced.

Upon completing the n-type layer deposition, the active layer and p-type layer depositions are performed under normal epitaxial growth conditions.

Properties of as-Fabricated GaN-Based LED Devices

It is observed that the GaN-based LEDs fabricated using the process taught herein exhibit ultra-high reverse breakdown voltages. The typical reverse breakdown voltages obtained using this technique can be equal to or greater than 60 volts. Reverse breakdown voltages equal to or greater than 110 volts have also been obtained. Compared with conventional LEDs which typically have reverse breakdown voltages at approximately 20 volts, the GaN LEDs fabricated using the provided technique exhibit significantly improved reliability.

Moreover, it is observed that the turn-on voltage of GaN-based LEDs fabricated using the present inventive techniques can be equal to or less than 3 volts, which is substantially the same as those of GaN LEDs fabricated using conventional processes.

Although the present invention is described in the context of GaN LEDs, the proposed technique is also applicable to fabricating GaN-based semiconductor laser to achieve high reverse breakdown voltages.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A gallium nitride (GaN)-based semiconductor light-emitting device (LED), comprising:
    an n-type GaN-based semiconductor layer (n-type layer);
    an active layer; and
    a p-type GaN-based semiconductor layer (p-type layer);
    wherein the n-type layer is epitaxially grown by using ammonia gas (NH$_3$) as the nitrogen source prior to growing the active layer and the p-type layer;
    wherein a flow rate ratio between group V and group III elements, or a V/III ratio, during the epitaxial growth of the n-type layer is gradually reduced from an initial value to a final value; and
    wherein the n-type layer includes a sublayer grown after the V/III ratio is reduced to the final value, the sublayer thus having a substantially lower Ga/N ratio than the rest of the n-type layer; wherein the sublayer is in contact with the active layer, and wherein the sublayer has a thickness of less than 1000 angstroms.

2. The GaN-based semiconductor LED of claim 1, wherein the GaN-based LED exhibits a reverse breakdown voltage equal to or greater than 60 volts.

3. The GaN-based semiconductor LED of claim 1, wherein the initial V/III ratio is approximately between 1000 and 10000; and
    wherein the final V/III ratio is approximately between 150 and 500.

4. The GaN-based semiconductor LED of claim 3, wherein the initial V/III ratio is approximately between 2000 and 5000.

5. The GaN-based semiconductor LED of claim 3, wherein the final V/III ratio is approximately between 200 and 300.

6. The GaN-based semiconductor LED of claim 1, wherein the active layer is sufficiently close to the location in the n-type layer where the final V/III ratio is reached.

7. The GaN-based semiconductor LED of claim 6, wherein the active layer is within 1000 angstroms to the location in the n-type layer where the final V/III ratio is reached.

8. The GaN-based semiconductor LED of claim 1, wherein the V/III ratio reduction process starts shortly after the n-type layer epitaxial growth begins.

9. The GaN-based semiconductor LED of claim 1, wherein the V/III ratio reduction process is substantially linear with a substantially constant reduction rate.

10. The GaN-based semiconductor LED of claim 1, wherein the duration of the reduction of the V/III ratio from the initial V/III ratio to the final V/III ratio is sufficiently long.

11. The GaN-based semiconductor LED of claim 1, wherein the reverse breakdown voltage of the GaN-based LED is equal to or greater than 110 volts.

12. The GaN-based semiconductor LED of claim 1, wherein the turn-on voltage of the GaN-based LED is equal to or less than 3 volts.

13. The GaN-based semiconductor LED of claim 1, wherein the active layer is an InGaN/GaN multiple-quantum-well (MQW) layer.

14. A method for fabricating a gallium nitride (GaN)-based semiconductor light-emitting device (LED), comprising:
    epitaxially growing on a growth substrate an n-type GaN-based semiconductor layer (n-type layer) using ammonia gas (NH$_3$) as the nitrogen source, wherein while epitaxially growing the n-type layer, gradually reducing a flow rate ratio between group V and group III elements, or a V/III ratio, from an initial value to a final value, and wherein the gradual reduction of the flow rate has a duration that is equal to or greater than a total time for epitaxially growing the n-type layer; and
    epitaxially growing an active layer and a p-type GaN-based semiconductor layer (p-type layer) on the n-type layer, wherein the active layer is adjacent to an n-type GaN sublayer that is grown after the V/III ratio is reduced to the final value;
    wherein the n-type layer, the active layer, and the p-type layer form the structure of the GaN-based LED.

15. The method of claim 14, wherein the GaN-based LED exhibits a reverse breakdown voltage equal to or greater than 60 volts.

16. The method of claim 14, wherein the initial V/III ratio is approximately between 1000 and 10000; and
    wherein the final V/III ratio is approximately between 150 and 500.

17. The method of claim 16, wherein the initial V/III ratio is approximately between 2000 and 5000.

18. The method of claim 16, wherein the final V/III ratio is approximately between 200 and 300.

19. The method of claim 14, wherein the active layer is sufficiently close to the location in the n-type layer where the final V/III ratio is reached.

20. The method of claim 19, wherein the active layer is within 1000 angstroms to the location in the n-type layer where the final V/III ratio is reached.

21. The method of claim 14, wherein the method further comprises starting the V/III ratio reduction process shortly after the n-type layer epitaxial growth begins.

22. The method of claim 14, wherein gradually reducing the V/III ratio involves reducing the V/III ratio substantially linearly from the initial V/III ratio to the final V/III ratio.

23. The method of claim 14, wherein the duration of gradually reducing the V/III ratio from the initial V/III ratio to the final V/III ratio is sufficiently long.

24. The method of claim 14, wherein the reverse breakdown voltage of the GaN-based LED is equal to or greater than 110 volts.

25. The method of claim 14, wherein the turn-on voltage of the GaN-based LED is equal to or less than 3 volts.

26. The method of claim 14, wherein the active layer is an InGaN/GaN multiple-quantum-well (MQW) layer.

27. A system for fabricating a gallium nitride (GaN)-based semiconductor light-emitting device (LED), comprising:
- a deposition mechanism configured to epitaxially grow on a growth substrate an n-type GaN-based semiconductor layer (n-type layer) while using ammonia gas ($NH_3$) as the nitrogen source,
  - wherein the deposition mechanism is configured to gradually reduce a flow rate ratio between group V and group III elements, or a V/III ratio, from an initial value to a final value, wherein the gradual reduction of the flow rate has a duration that is equal to or greater than a total time for epitaxially growing the n-type layer;
- wherein the deposition mechanism is configured to epitaxially grow an active layer and a p-type GaN-based semiconductor layer (p-type layer) on the n-type layer;
- wherein the n-type layer, the active layer, and the p-type layer form the structure of the GaN-based LED, wherein the active layer is adjacent to an n-type GaN sublayer that is grown after the V/III ratio is reduced to the final value; and
- wherein the GaN-based LED exhibits a reverse breakdown voltage equal to or greater than 60 volts.

* * * * *